(12) United States Patent
Faue

(10) Patent No.: US 6,584,578 B1
(45) Date of Patent: Jun. 24, 2003

(54) ARBITRATION METHOD AND CIRCUIT FOR CONTROL OF INTEGRATED CIRCUIT DOUBLE DATA RATE (DDR) MEMORY DEVICE OUTPUT FIRST-IN, FIRST-OUT (FIFO) REGISTERS

(75) Inventor: Jon Allan Faue, Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/524,644

(22) Filed: Mar. 14, 2000

(51) Int. Cl.⁷ .............................. G06F 1/04; G06F 1/12
(52) U.S. Cl. ........................ 713/503; 713/500; 713/502; 711/100; 711/101; 711/105
(58) Field of Search ................................ 713/500, 502, 713/503; 711/100, 105, 167, 170

(56) References Cited

U.S. PATENT DOCUMENTS 6,014,341 A * 1/2000 Koshikawa .................. 365/233
6,242,960 B1 * 6/2001 Bae ............................. 327/299
6,249,483 B1 * 6/2001 Kim ............................. 365/233
6,369,615 B1 * 4/2002 Shimizu et al. ............... 326/93

* cited by examiner

Primary Examiner—Thomas Lee
Assistant Examiner—Paul Yanchus
(74) Attorney, Agent, or Firm—William J. Kubida; Peter J. Meza; Hogan & Hartson LLP

(57) ABSTRACT

An arbitration method and circuit for control of double data rate ("DDR") dynamic random access memory ("DRAM") device first-in, first-out ("FIFO") registers which allows the data path of the device to be functional over a wider range of system clock and delay locked loop ("DLL") clock signal skews. By comparing the system and DLL clocks, the circuit and method of the present invention determines whether the DLL clock should be considered "faster" than the system clock, or "slower." Functionally, it then attempts to force all cases into the "fast" condition until a determination is made that the amount of advance is now so fast, that data corruption in the pipeline might occur. Only in this case will it force the result to be "slow," adding 1 cycle to the output control path, and thereby correcting the data flow. In a particular embodiment disclosed herein, the overlaps (both clocks=1) of the DLL and system clock are compared against a predetermined limit. This predetermined limit, or delay, is based on knowledge of the entire data path and how much total advance in the DLL can be accurately supported.

21 Claims, 5 Drawing Sheets

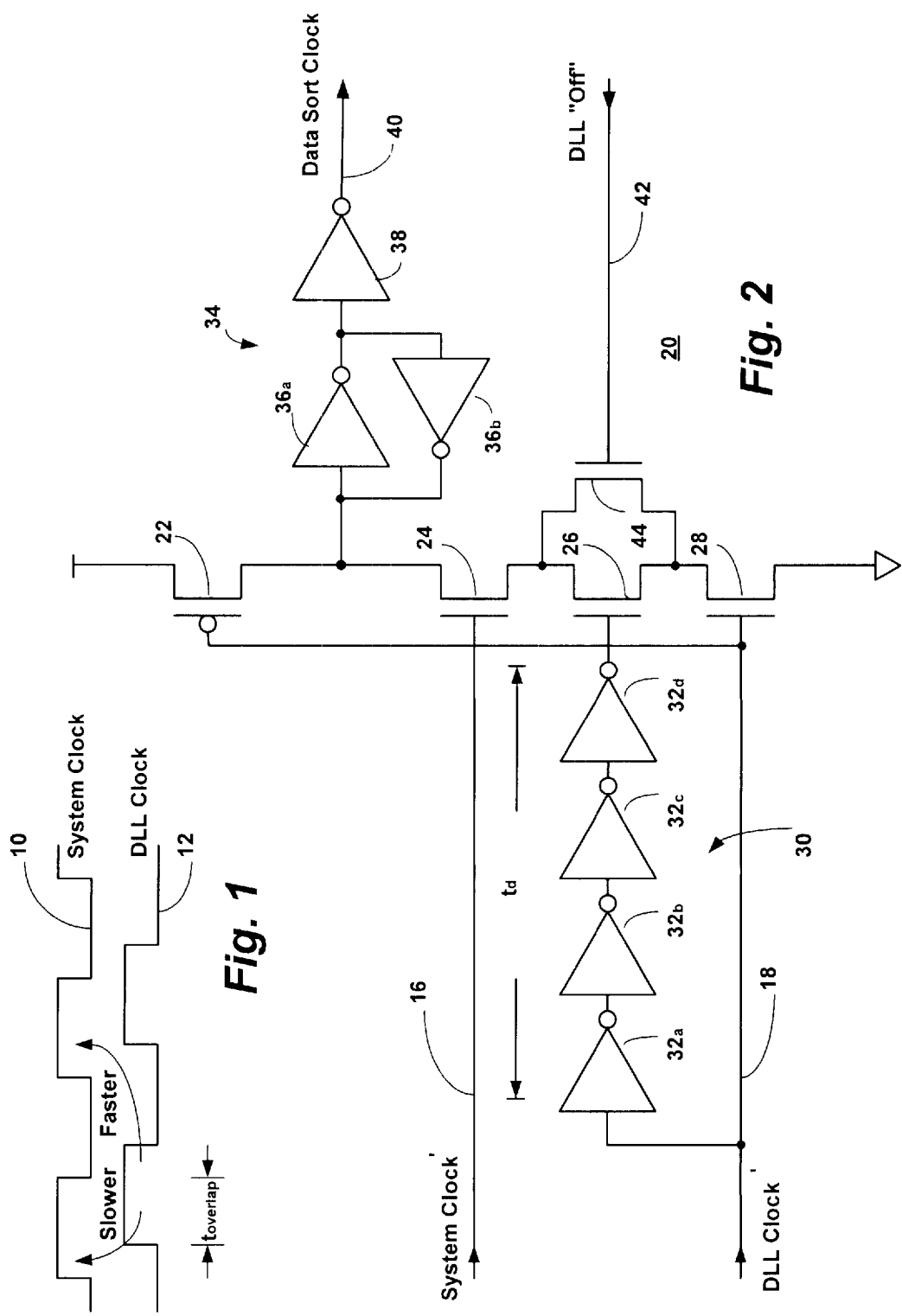

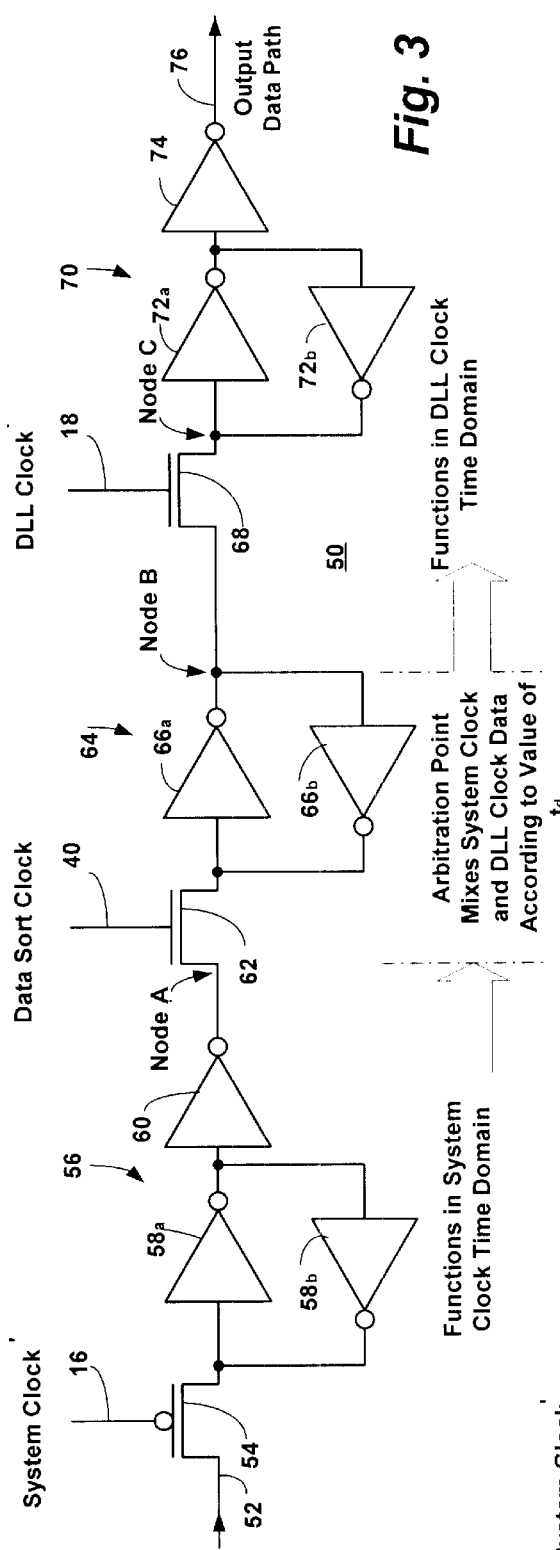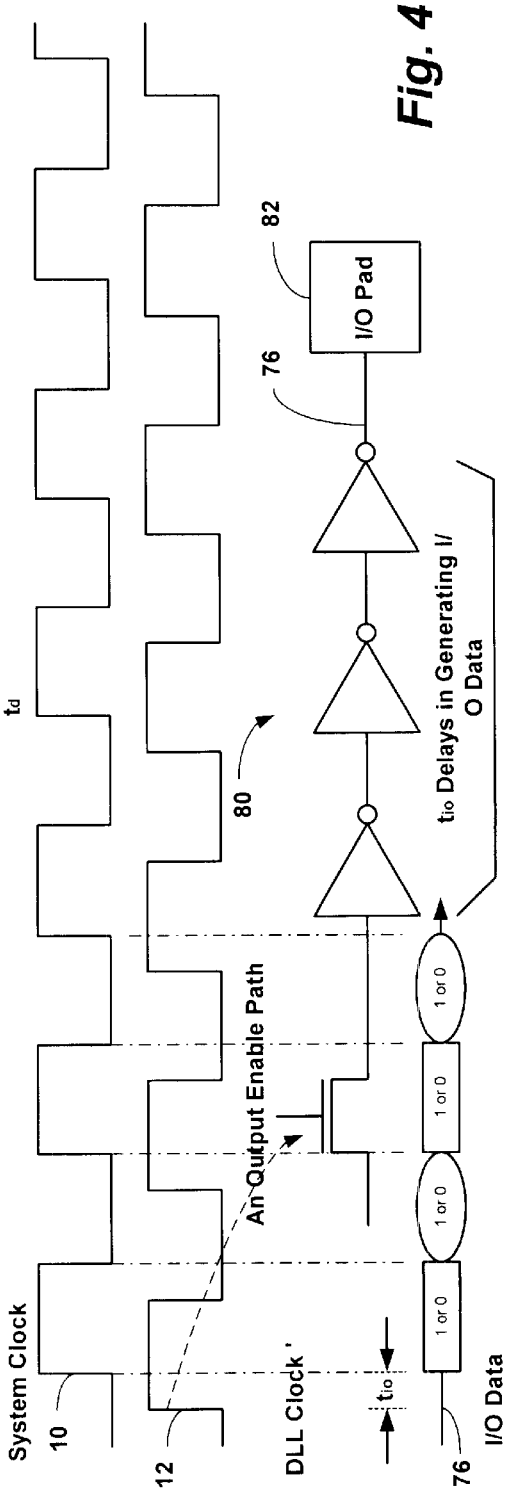

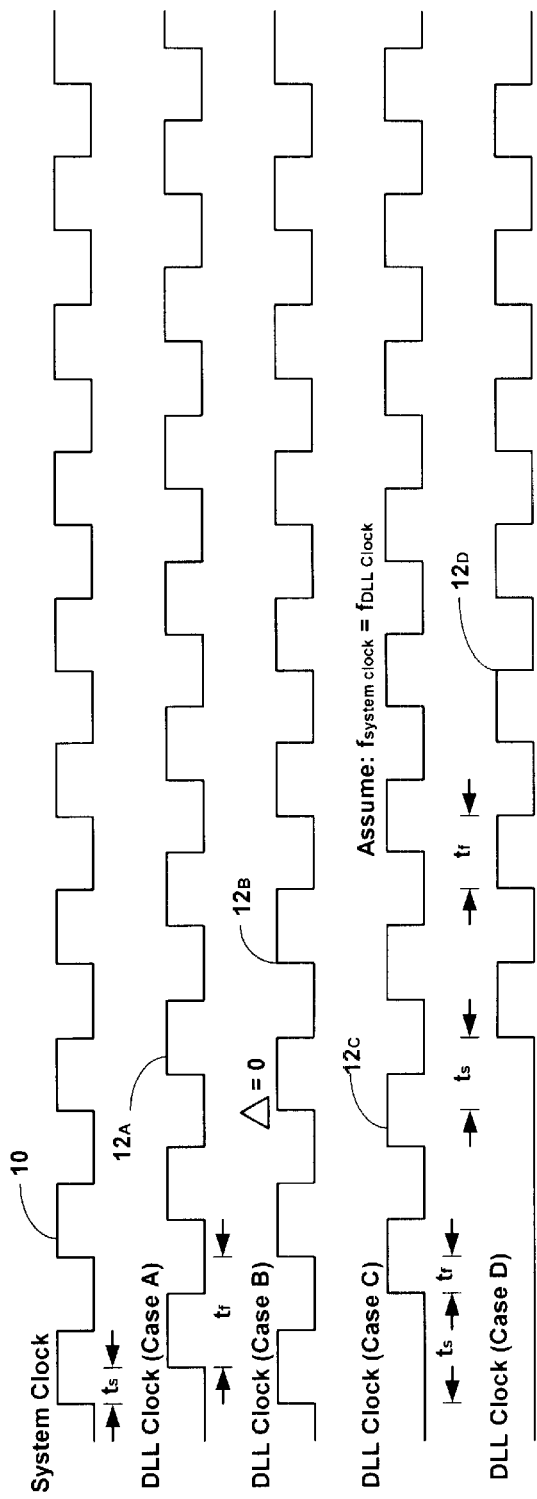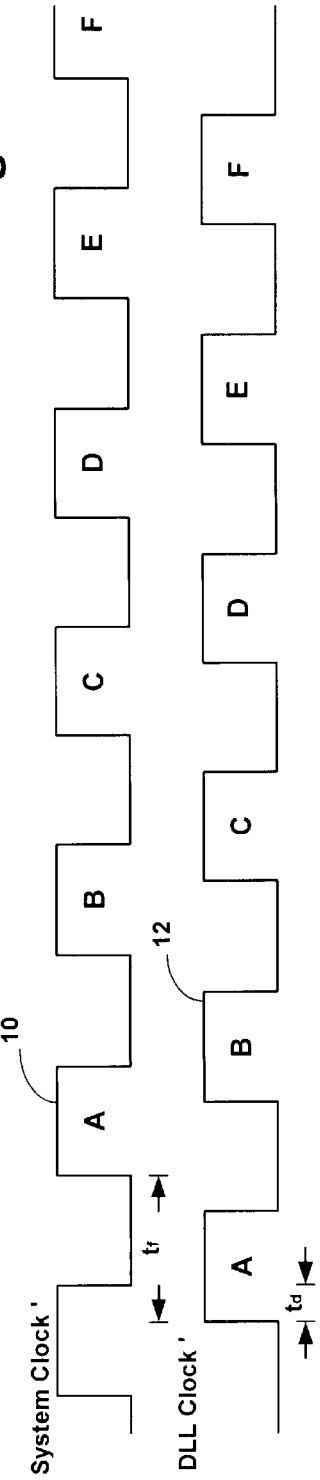

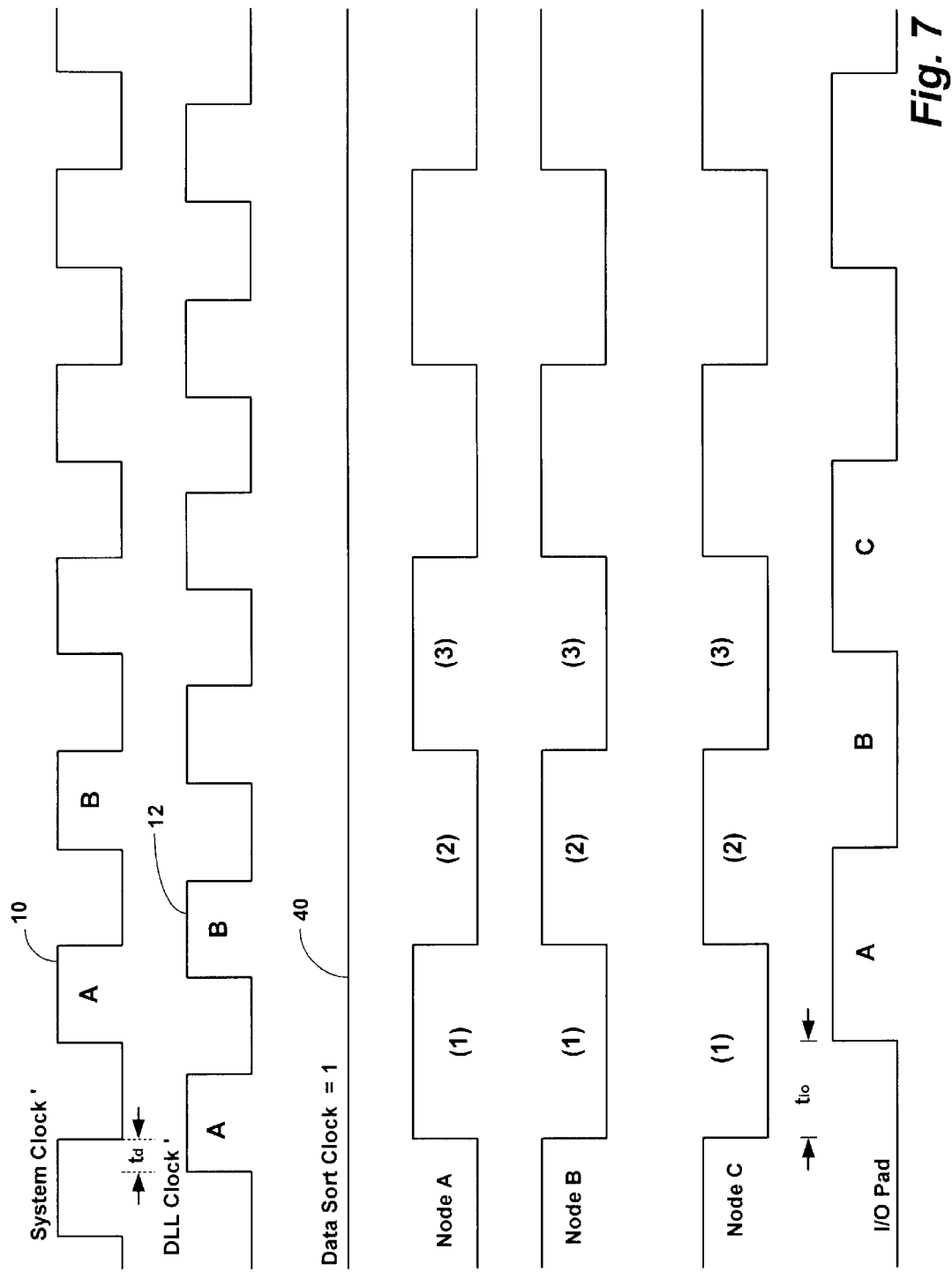

ARBITRATION METHOD AND CIRCUIT FOR CONTROL OF INTEGRATED CIRCUIT DOUBLE DATA RATE (DDR) MEMORY DEVICE OUTPUT FIRST-IN, FIRST-OUT (FIFO) REGISTERS

BACKGROUND OF THE INVENTION

The present invention relates, in general, to the field of integrated circuit double data rate ("DDR") dynamic random access memory ("DRAM") devices. More particularly, the present invention relates to an arbitration method and circuit for control of DDR DRAM output first-in, first-out ("FIFO") registers.

Historically, in order to synchronize data transfers among system logic devices, data transfers to/from conventional DRAM devices would be initiated on either the rising (the transition from logic level "zero" to "one") or falling (the transition from logic level "one" to "zero") edge of a clock signal. DDR DRAM memory devices differ from conventional DRAM by enabling output operations to occur on both the rising and falling edges of the clock, thereby effectively doubling the device's output frequency without increasing the actual clock frequency.

DDR DRAM device functionality is specified by a Joint Electron Devices Engineering Counsel ("JEDEC") standard, one aspect of which is that the output data must be aligned with the input clock signal. One method utilized for DDR DRAM devices to be able to achieve this effective data alignment is by the inclusion of delay lock loop ("DLL") circuitry to enable the pre-fetching of data sufficiently in advance of when it must be output. In general, this necessary advance is substantially constant for any given delays in the input/output ("I/O") datapath. However, problems in device operation can sometime occur if the skew between the system and DLL clock signals exceeds an acceptable range.

SUMMARY OF THE INVENTION

Disclosed herein is an arbitration method and circuit for control of DDR DRAM device FIFO registers which allows the data path of the device to be functional over a wider range of system clock and DLL clock signal skews.

By comparing the system and DLL clocks, the circuit and method of the present invention determines whether the DLL clock should be considered "faster" than the system clock, or "slower." Functionally, the circuit and method of the present invention attempts to force all cases into the "fast" condition until a determination is made that the amount of advance is now so fast that data corruption in the pipeline might occur. Only in this case will it force the result to be "slow," adding 1 cycle to the output control path, and thereby correcting the data flow. In a particular embodiment disclosed herein, the overlaps (both clocks=1) of the DLL and system clock are compared against a predetermined limit. This predetermined limit, or delay, is based on knowledge of the entire data path and how much total advance in the DLL can be accurately supported.

Particularly disclosed herein is a method for associating a first clock signal with a second derivative clock signal and means for implementing the method comprising the steps of: determining an overlap between the first and second clock signals; comparing the determined overlap with a predetermined overlap limit; considering the second clock signal to be faster than the first clock signal if the determined overlap is less than the predetermined overlap limit; and utilizing the second clock signal to clock data through an integrated circuit device. In a particular embodiment the method and means for implementing the method may include the additional steps of alternatively considering the second clock signal to be slower than the first clock signal if the determined overlap is equal to or greater than the predetermined skew limit and adding one clock cycle delay to the data being clocked by the second clock signal.

Further disclosed herein is an arbitration circuit for an integrated circuit memory device data path that comprises a first portion coupled to receive a system clock signal, a second portion coupled to receive a delay locked loop clock signal and a third portion thereof coupled to receive a data sort clock signal derived from said system and delay locked loop clock signals. In a particular embodiment, the circuit is operative to mix system and delay locked loop data on the data path in accordance with a delay time between the system and delay locked loop clock signals.

Also further disclosed herein is a circuit for generating a data sort clock signal from an input system clock and delay locked loop clock signals. The circuit comprises first, second, third and fourth series connected switching devices, each having a respective control terminal thereof, with the delay locked loop clock signal being coupled to the control terminal of the first and fourth switching devices and the system clock signal being coupled to the control terminal of the second switching device. A delay circuit is coupled to receive the delay locked loop clock signal for providing a delayed delay locked loop clock signal to the control terminal of the third switching device and a latch circuit is coupled intermediate the first and second switching devices for providing the data sort clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified timing diagram of system and DLL clock signals in a representative DDR DRAM memory device and indicating that the DLL clock might be considered to be currently either running ahead of the system clock (faster) or, alternatively, behind (slower);

FIG. 2 is a schematic and functional block diagram of a circuit in accordance with a specific embodiment of the present invention useful in deriving a Data Sort Clock ("$DS_{clk}$") signal for determining when data cannot be passed between the system and DLL clock domains;

FIG. 3 is a further schematic and functional block diagram of another circuit in accordance with a specific embodiment of the present invention for utilizing the $DS_{clk}$ signal of the circuit of FIG. 2;

FIG. 4 is a combined timing diagram of the system and DLL clock signals relative to the memory device input/output ("I/O") data path illustrative of the fact that, for the output data edges to be synchronized with the system clock, the DLL clock must be faster than the system clock;

FIG. 5 is a follow-on timing diagram illustrative of the fact that, while in the example of FIG. 4 the DLL clock must be advanced relative to the system clock, its skew with respect to the system clock can change, especially under non-normal operating conditions;

FIG. 6 is a further timing diagram of derivatives of the system and DLL clock signals indicating that the value of $t_d$ is set equal to the overlap of the two signals when the DLL clock signal is running at the maximum advance point and wherein the DLL clock signal at "A" is analogous to the system clock signal at "A" advanced by the time $t_f$ (i.e., running "fast");

FIG. 7 is a further timing diagram illustrating the system, DLL and Data Sort clock signals as well as the resultant signals taken at Nodes A–C of the circuit in FIG. 3 illustrating a condition of maximum frequency and maximum advance.

DESCRIPTION OF A PREFERRED EMBODIMENT

Figure 8:
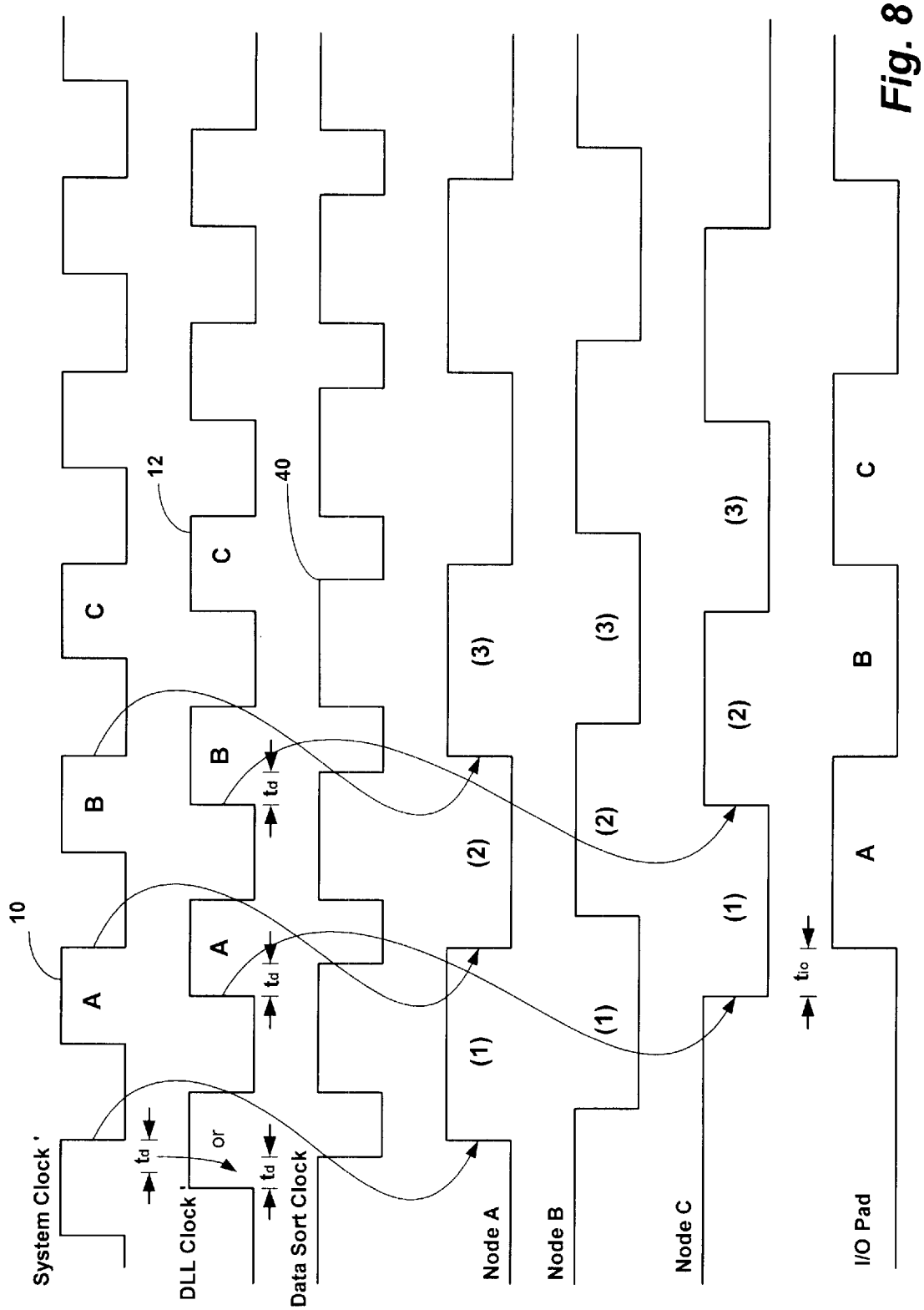
FIG. 8 is a comparative timing diagram of the signals illustrated in FIG. 7 illustrative of a condition of maximum frequency and the DLL signal being retarded (or running "slow") with respect to the system clock signal.

With reference to FIG. 1, a simplified timing diagram of a system 10 and DLL 12 clock signals is shown as would be found in a representative DDR DRAM memory device. In this figure, the skew between the system clock 10 and DLL clock 12 is illustrated to show that the DLL clock 12 might be functionally considered to be currently either running ahead of the system clock 10 (faster) or, alternatively, behind (slower). The time of overlap between the system clock 10 and the DLL clock 12 is illustrated as $t_{overlap}$ (that time period during which both are at a logic level "one").

With reference additionally now to FIG. 2, a schematic and functional block diagram of a circuit 20 in accordance with a specific embodiment of the present invention is shown. The circuit 20 is useful in deriving a Data Sort Clock ("$DS_{clk}$") signal 40, as will be more fully described hereinafter, for determining when data cannot be passed between the system clock 10 and DLL clock signal 12 domains.

The circuit 20 comprises an input line 16 for receiving the system clock signal 10 or a derivative thereof as well as input line 18 for receiving the DLL clock signal 12 or its corresponding derivative. Both the system clock and DLL clock signals 10, 12 are supplied to the gate terminals of a multi-input DSCLK circuit comprising series connected P-channel transistor 22 and N-channel transistors 24, 26 and 28 which couple a supply voltage source to circuit ground as shown. The input line 16 is coupled to the gate terminal of N-channel transistor 24 and the input line 18 is coupled to the gate terminals of P-channel transistor 22 as well as N-channel transistor 28. A delay line 30 for imposing a delay of td on the DLL clock signal 12 comprising a number of series connected inverting amplifier stages $32_a$–$32_d$ is coupled between the input line 18 and the gate of transistor 26. It should be noted that any other type of signal delay circuitry might be utilized instead of the series connected inverting amplifier stages $32_a$–$32_d$. The selection of the delay time, $t_d$, is a matter of design choice based on knowledge of the entire data path and how much total advance in the DLL can be accurately supported.

Output from the DSCLK circuit is taken at the node between P-channel transistor 22 and N-channel transistor 24 and is supplied through an amplification section 34 comprising a latch made up of cross-coupled inverting amplifiers $36_a$ and $36_b$ which is amplified through inverting amplifier 38 to provide a Data Sort Clock ("$DS_{clk}$") Signal 40. An optional DLL "Off" signal 42 may be supplied to the circuit 20 through the provision of an additional N-channel transistor 44 in parallel with N-channel transistor 26 as will be more fully described hereinafter. Fundamentally, the design philosophy underlying the circuit 20 is, rather than design a clock circuit and/or signal that combines the system clock signal 10 and DLL clock signal 12 and then determine when data could be passed from one domain to the other, the circuit 20 is operational instead to determine when data cannot be passed between the two domains.

With reference additionally now to FIG. 3, a further schematic and functional block diagram of another circuit 50 in accordance with a specific embodiment of the present invention is shown. The circuit 50 is operative for utilizing the $DS_{clk}$ signal 40 derived by the circuit 20 of FIG. 2.

The circuit 50 controls the data path of a DDR memory device and receives an input line 52 which is supplied to one terminal of P-channel transistor 54 which has its gate coupled to receive a derivative of the system clock signal 10 on input line 16 (FIG. 2). The other terminal of P-channel transistor 54 is coupled to the input of a latch 56 comprising cross-coupled inverting amplifiers $58_a$ and $58_b$. The output of the latch 56 is supplied through inverting amplifier 60 to one terminal of N-channel transistor 62 which has its date coupled to receive the Data Sort Clock signal 40 at the output of circuit 20 (FIG. 2). The output of inverting amplifier 60 is defined as Node A for purposes of further analysis hereafter.

The other terminal of N-channel transistor 62 is coupled through a latch 64 comprising cross-coupled inverting amplifiers $66_a$ and $66_b$, and then supplied to one terminal of another N-channel transistor 68 which defines an additional Node B. The gate terminal of N-channel transistor 68 is coupled to input line 18 (FIG. 2) to receive the derivative of the DLL clock signal 12. The other terminal of N-channel transistor 18 defines a Node C and is coupled through a latch 70, comprising cross-coupled inverting amplifiers $72_a$ and $72_b$, to the input of inverting amplifier 74. The output of inverting amplifier 74 defines the output path 76 for the circuit 50.

As is indicated, that portion of the circuit 50 from the input path 52 through Node A, functions in the system clock signal 10 time domain while that portion from Node B towards the output path 76 functions in the DLL clock signal 12 domain. That portion of the circuit 50 between Nodes A and B defines an arbitration point which mixes the system clock signal 10 and the DLL clock signal 12 data according to the value of the delay time $t_d$ as will be described and illustrated with respect to the succeeding figures.

With reference additionally now to FIG. 4, a combined timing diagram of the system clock 10 and DLL clock 12 signals is shown relative to the memory device input/output ("I/O") data path. This figure is illustrative of the fact that, for the output data edges to be synchronized with the system clock signal 10, the DLL clock signal 12 must be faster than the system clock signal 10. Further, the DLL clock signal 12 must be advanced relative to the system clock signal 10 (by an amount equal to $t_{io}$) in order for the output data edges (on output data path 76) to be synchronized with the system clock signal 10 as shown. The $t_{io}$ delays are illustrated in a simplified sense by a number of amplification stages 80 occurring on an output data path 76 prior to its coupling to a DDR DRAM memory device input/output ("I/O") pad 82.

With reference additionally now to FIG. 5, a follow-on timing diagram to that of the preceding figures is shown illustrative of the fact that, while in the example of FIG. 4 the DLL clock signal 12 must be advanced relative to the system clock signal 10, its skew with respect to the system clock signal 10 can change, especially under non-normal device operating conditions, such as those encountered during device test.

Assuming the frequencies of the system clock signal 10 and the DLL clock signal 12 are at least matched, this figure indicates that there are an infinite number of phase shift possibilities between the two signals, and the problem lies in deciding whether or not the DLL clock signal 12 is "fast" or "slow" relative to the system clock signal 10. In operation, when passing DDR DRAM memory device data from the system clock signal 10 domain to the DLL clock signal 12 domain, making this decision is critical. With respect to Case D in particular, where $t_s=t_f$, and the two clock signals are 180° out of phase, it is impossible to determine whether or not the DLL clock signal 12 is "fast" or "slow" with respect to the system clock signal 10. If the wrong determination is made, i.e., with respect to "fast" vs. "slow", the data flow may appear correct, but it will be in the wrong position and the latency will be wrong. Therefore, the data might appear 2 clocks after a DDR DRAM memory device "Read" command instead of the intended 3 clocks.

Functionally, the present invention is operative to initially determine the fastest (or highest) frequency for which the data path should operate and, for that frequency, determine how much advance the DLL clock signal 12 can have relative to the system clock signal 10 and still be functional. (It should be noted that this amount of advance may be a much higher value than the typical DDR DRAM memory device specification would allow). Of course, an infinite amount of advance is not possible, at some point the data coming out of the system clock domain is the limiting factor.

The circuit and method of the present invention advantageously arbitrates the data flow, that is, it attempts to keep the DLL interaction in a "fast" state, until it determines that such is no longer possible. At that point, it forces the data path to assume the DLL clock signal 12 is "slow". The provision of the optional "DLL off" signal 42 (FIG. 2), when set, will effectively bypass this arbitration and force all cases to be slow.

With reference additionally now to FIG. 6, a further timing diagram of derivatives of the system clock 10 and DLL clock 12 signals is shown indicating that the value of $t_d$ has been set equal to the overlap of the two signals 10, 12 when the DLL clock signal 12 is running at the maximum advance point and wherein the DLL clock signal 12 at "A" is analogous to the system clock signal 10 at "A" advanced by the time $t_f$, that is, it is running "fast".

With reference additionally now to FIG. 7, a further timing diagram is shown illustrating the system clock signal 10, DLL clock signal 12 and Data Sort clock signal 40 as well as the resultant signals taken at Nodes A–C and the I/O pad of the circuits in FIGS. 3 and 4. The signals in this figure illustrate a condition of maximum frequency and maximum advance. The DLL clock signal 12 is ahead of the system clock signal 10 and the delay time $t_d$ is as shown.

Referring back to FIG. 2 as well, when the DLL clock signal on line 18 is at a logic "low" level, this turns N-channel transistor 28 "off" and P-channel transistor 22 "on". This brings the node intermediate the P-channel transistor 22 and N-channel transistor 24 to a logic "high" level. The latch comprising cross-coupled inverting amplifiers $36_a$ and $36_b$, then provides a logic level "low" at the input of inverting amplifier 38 which then provides a logic level "high" on line 40. The output on line 40 will remain at a logic "high" level as shown in FIG. 7 due to the presence of the latch until such time as a logic level "high" signal is applied simultaneously to the gates of N-channel transistors 24, 26 and 28. This will only occur if the system clock signal 10 on line 16, the DLL clock signal 12 on line 18 and the delayed DLL clock signal at the output of the string of inverters $32_a$ though $32_d$ are all "high" simultaneously. For this to occur, the DLL clock 12 signal advance must be longer than the predetermined delay set by means of the inverters $32_a$ though $32_d$. At the point of maximum allowable advance for the DLL clock 12 signal, this will not occur.

Referring back to FIGS. 3 and 4 as well, it can be seen that when the data sort clock signal on line 40 is set at a constant logic level "high", the N-channel transistor 62 remains "on" and the signal at Node A will be the same as the signal at Node B but inverted due to the inversion of the latch 64. When the DLL clock signal 12 on line 18 goes "high", this places the signal at Node B on Node C as well. The signal at the I/O pad 82 is then the inverse of the signal at Node C (due to an odd number of inverting amplifiers 80) and delayed by an amount $t_{io}$.

With reference additionally now to FIG. 8, a comparative timing diagram of the signals illustrated in FIG. 7 is shown illustrative of a condition of maximum frequency and the DLL clock signal 12 being retarded (or running "slow") with respect to the system clock signal 10.

Referring back to FIG. 2 once again, when the system clock signal 10 on line 16 is at a logic "high" level, N-channel transistor 24 is turned "on". When the DLL clock signal 12 on line 18 is also at a logic "high" level, N-channel transistor 28 is turned "on" and P-channel transistor 22 is turned "off". If the DLL clock signal 12 remains at a logic "high" level for a time $t_d$ as determined by the delay through the inverting amplifiers $32_a$ through $32_d$ inclusive, then a logic level "high" signal will also appear at the gate of N-channel transistor 26. The confluence of a logic level "high" at the gates of N-channel transistors 24, 26 and 28 then causes the node intermediate P-channel transistor 22 and N-channel transistor 24 to be at a logic "low" level. In turn, this causes the data sort clock signal on line 40 to transition to a logic "low" level and remain there until the DLL clock 12 signal on line 18 goes "low". This turns "off" N-channel transistor 28 and turns P-channel transistor 22 "on". This brings the node intermediate P-channel transistor 22 and N-channel transistor 24 "high" resulting in a transition to a logic "high" state on line 40. The data sort clock signal on line 40 then remains in this condition until a logic level "high" again appears at the gates of all three N-channel transistors 24, 26 and 28 with P-channel transistor 22 turned "off".

Applying these waveforms to the lines 16, 18 and 40 of FIG. 3 and with further reference to FIG. 4, it can be seen that the signal at Node B will again be inverted from that at Node A but delayed due to the functioning of the data sort clock signal on line 40 such that Node B will transition when the DLL clock signal 12 is "0" and the Data Sort clock signal 40 resets to a "1". The signal at Node B will be transferred to Node C when the DLL clock signal 12 next transitions to a logic "high" level turning on transistor 68. As before, the signal on the I/O pad 82 will be inverted and delayed by an amount $t_{io}$.

In this example, data would be output "late" with respect to the system clock signal 10 indicated as "A", but still correct because the $DS_{CLK}$ signal 40 "engaged" and forced the data path to run slowly, the correct data appears at the output. As the variable of frequency (running slower than the max case), temperature/mobility/voltage (changes here make $t_d$ and $t_{io}$ appear larger or smaller compared to the cycle time) are combined with yet more different phase shifts (system clock signal 10 vs. DLL clock 12) and an almost infinite number of representative timing diagrams can be produced.

While there have been described above the principles of the present invention in conjunction with specific circuitry and applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An arbitration circuit for an integrated circuit memory device data path, said arbitration circuit comprising:
   a first portion thereof coupled to receive a system clock signal;
   a second portion thereof coupled to receive a delay locked loop clock signal; and
   a third portion thereof coupled to receive a data sort clock signal derived from said system and delay locked loop clock signals.

2. The circuit of claim 1 wherein said third portion thereof is intermediate said first and second portions.

3. The circuit of claim 1 wherein said third portion thereof is operative to mix system and delay locked loop data on said data path in accordance with a delay time between said system and delay locked loop clock signals.

4. The circuit of claim 1 wherein said first portion thereof comprises a switching device in said data path having a control terminal thereof coupled to receive said system clock signal.

5. The circuit of claim 4 wherein said first portion thereof further comprises a latch circuit in said data path.

6. The circuit of claim 1 wherein said second portion thereof comprises a switching device in said data path having a control terminal thereof coupled to receive said delay locked loop clock signal.

7. The circuit of claim 6 wherein said first portion thereof further comprises a latch circuit in said data path.

8. The circuit of claim 1 wherein said third portion thereof comprises a switching device in said data path having a control terminal thereof coupled to receive said data sort clock signal.

9. The circuit of claim 8 wherein said first portion thereof further comprises a latch circuit in said data path.

10. A circuit for generating a data sort clock signal from an input system clock and delay locked loop clock signals, said circuit comprising:
    first, second, third and fourth series connected switching devices having a respective control terminal thereof; said delay locked loop clock signal being coupled to said control terminal of said first and fourth switching devices and said system clock signal being coupled to said control terminal of said second switching device;
    a delay circuit coupled to receive said delay locked loop clock signal for providing a delayed delay locked loop clock signal to said control terminal of said third switching device; and
    a latch circuit coupled intermediate said first and second switching devices for providing said data sort clock signal.

11. The circuit of claim 10 wherein said first, second, third and fourth switching devices comprise MOS transistors.

12. The circuit of claim 11 wherein said first switching device comprises a P-channel MOS transistor and said second, third and fourth switching devices comprise N-channel MOS transistors.

13. The circuit of claim 10 wherein said delay circuit comprises a plurality of buffers.

14. The circuit of claim 10 wherein said latch circuit comprises a pair of cross-coupled inverters.

15. The circuit of claim 10 further comprising:
    a fifth switching device in parallel with said third switching device, said fifth switching device having a control terminal thereof for receiving a delay locked loop disable signal.

16. An integrated circuit memory device comprising:
    a system clock signal and a derivative delay clock signal, wherein said derivative delay clock signal runs either ahead of or behind said system clock;
    a data sort clock circuit coupled to receive said system clock signal and said delay clock signal to provide a data sort clock signal; and
    at least one data path selectively enablable by said system clock signal, said delay clock signal and said data sort clock signal.

17. A method for associating a first clock signal with a second derivative clock signal comprising:
    determining an overlap between said first and second clock signals;
    comparing said determined overlap with a predetermined overlap limit;
    considering said second clock signal to be faster than said first clock signal if said determined overlap is less than said predetermined overlap limit; and
    utilizing said second clock signal to clock data through an integrated circuit device.

18. The method of claim 17 further comprising the steps of:
    alternatively considering said second clock signal to be slower than said first clock signal if said determined overlap is equal to or greater than said predetermined overlap limit; and
    delaying said data being clocked by said second clock signal by one clock cycle.

19. An arbitration circuit for associating a first clock signal with a second derivative clock signal in an integrated circuit memory device, said circuit comprising:
    means for determining an overlap between said first and second clock signals;
    means for comparing said determined overlap with a predetermined overlap limit;
    means for considering said second clock signal to be faster than said first clock signal if said determined overlap is less than said predetermined overlap limit; and
    means for utilizing said second clock signal to clock data through an integrated circuit device.

20. The circuit of claim 19 further comprising:
    means for alternatively considering said second clock signal to be slower than said first clock signal if said determined overlap is equal to or greater than said predetermined overlap limit; and
    means for delaying said data being clocked by said second clock signal by one clock cycle.

21. The circuit of claim 19 wherein said first clock signal is a system clock signal and said second derivative clock signal is a delay locked loop clock signal.

* * * * *